United States Patent
Chan et al.

(10) Patent No.: US 8,084,366 B2
(45) Date of Patent: Dec. 27, 2011

(54) MODIFIED DARC STACK FOR RESIST PATTERNING

(75) Inventors: Michael Chan, Mountain View, CA (US); Usha Raghuram, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 847 days.

(21) Appl. No.: 12/213,273

(22) Filed: Jun. 17, 2008

(65) Prior Publication Data

US 2009/0258495 A1 Oct. 15, 2009

Related U.S. Application Data

(60) Provisional application No. 61/071,089, filed on Apr. 11, 2008.

(51) Int. Cl.
*H01L 21/302* (2006.01)
*H01L 21/461* (2006.01)

(52) U.S. Cl. ............... 438/736; 438/717; 216/47

(58) Field of Classification Search ........... 438/694, 438/717, 736; 216/41, 47
See application file for complete search history.

(56) References Cited

U.S. PATENT DOCUMENTS

| | | | |
|---|---|---|---|
| 5,915,167 A | 6/1999 | Leedy | |
| 6,853,049 B2 | 2/2005 | Herner | |
| 6,875,664 B1 * | 4/2005 | Huang et al. | 438/299 |
| 6,946,719 B2 | 9/2005 | Petti et al. | |
| 6,952,030 B2 | 10/2005 | Herner et al. | |
| 2004/0192060 A1 | 9/2004 | Stegamann et al. | |
| 2005/0052915 A1 | 3/2005 | Herner et al. | |
| 2005/0226067 A1 | 10/2005 | Herner et al. | |
| 2006/0046483 A1 * | 3/2006 | Abatchev et al. | 438/689 |
| 2006/0250836 A1 | 11/2006 | Herner et al. | |
| 2006/0250837 A1 * | 11/2006 | Herner et al. | 365/148 |
| 2006/0286486 A1 | 12/2006 | Huang | |
| 2007/0072360 A1 | 3/2007 | Kumar et al. | |
| 2007/0082482 A1 | 4/2007 | Lee | |
| 2007/0164309 A1 | 7/2007 | Kumar et al. | |
| 2008/0013364 A1 * | 1/2008 | Kumar et al. | 365/148 |
| 2008/0057733 A1 | 3/2008 | Chung et al. | |

FOREIGN PATENT DOCUMENTS

| | | |
|---|---|---|
| WO | WO 03/007344 A2 | 1/2003 |
| WO | WO 03007344 A2 * | 1/2003 |
| WO | WO 2007/103343 A1 | 9/2007 |

(Continued)

OTHER PUBLICATIONS

International Bureau of WIPO. International Preliminary Report on Patentability, Intl. Application PCT/US09/39119. Oct. 21, 2010. 11 pages.

(Continued)

*Primary Examiner* — Roberts Culbert
(74) *Attorney, Agent, or Firm* — The Marbury Law Group, PLLC (57) ABSTRACT

A method of making a device includes forming a device layer, forming an organic hard mask layer over the device layer, forming a first oxide hard mask layer over the organic hard mask layer, forming a DARC layer over the first oxide hard mask layer, forming a photoresist layer over the DARC layer, patterning the photoresist layer to form a photoresist pattern, and transferring the photoresist pattern to the device layer using the DARC layer, the first oxide hard mask layer and the organic hard mask layer.

30 Claims, 6 Drawing Sheets

FOREIGN PATENT DOCUMENTS

WO    WO 2007103343 A1 *  9/2007

OTHER PUBLICATIONS

U.S. Appl. No. 11/864,205, filed Sep. 28, 2007, Yung-Tin Chen et al.
U.S. Appl. No. 11/819,595, filed Jun. 28, 2007, Kumar.
U.S. Appl. No. 11/864,532, filed Sep. 28, 2007, Maxwell.
U.S. Appl. No. 12/222,293, filed Aug. 6, 2008, Chan.
Ryoung-han Kim et al., "Double Exposure Using 193nm Negative Tone Photoresist", 2007, SPIE 6520-95, 8 pgs.
Hiroki Nakamura et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.
Hiroki Nakamura et al, "Low $k_1$ Contact Hole Formation by Double Line and Space Formation Method with Contact Hole Mask and Dipole Illumination", Japanese Journal of Applied Physics, vol. 45, No. 6B, 2006, pp. 5409-5417.
International Search Report and Written Opinion mailed Sep. 1, 2009, received in corresponding International Application No. PCT/US2009/039119 (16 pgs.).

* cited by examiner

MODIFIED DARC STACK FOR RESIST PATTERNING

BACKGROUND OF THE INVENTION

The invention relates generally to a photolithography method for making a semiconductor device, for example, a diode containing nonvolatile memory array.

Figure 1:
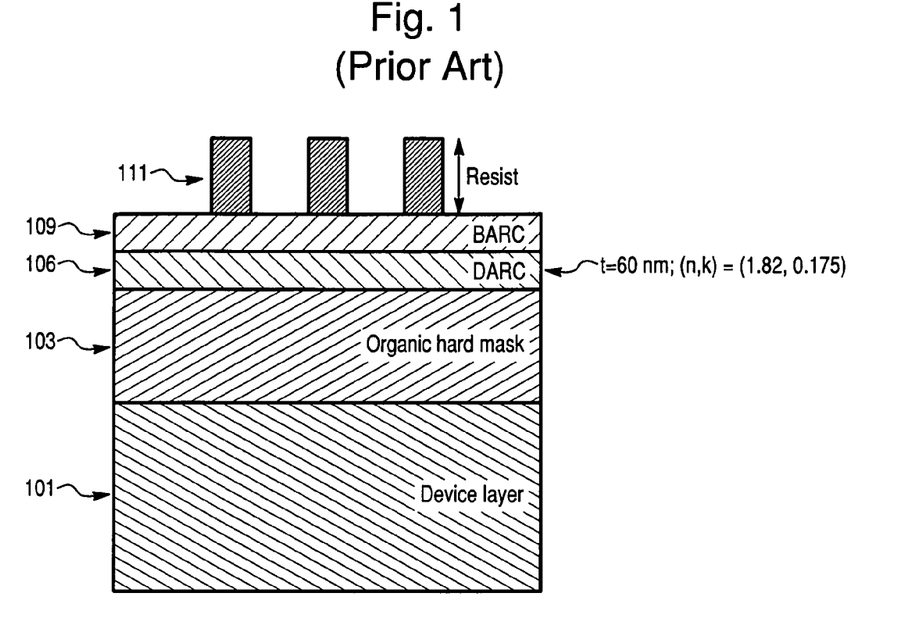
FIG. 1 is a side cross-sectional view illustrating a prior art hard mask configuration.

In order to fabricate 45 nm and 80 nm features, one prior art process uses a hard mask stack shown in FIG. 1. The stack consists of a layer of organic hard mask 103, also called advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 is located above the BARC layer.

A combination of the DARC 106 and the BARC 109 layers are used to ensure proper suppression of wafer reflectivity. Resist patterns 111 are first used to define the BARC 109 and the DARC 106 that in return is used to define the organic hard mask 103, followed by patterning a device layer 101. The thickness of the DARC 106 layer generally ranges from 60 to 80 nm, primarily driven by the need of providing sufficient masking for patterning the organic hard mask 103. For example, as shown in FIG. 1, DARC layer 106 may be 60 nm thick and have a refractive index of real part (n) of 1.82 and imaginary part (k) of 0.175.

SUMMARY

One embodiment of the invention provides a method of making a device comprising forming a device layer, forming an organic hard mask layer over the device layer, forming a first oxide hard mask layer over the organic hard mask layer, forming a silicon oxynitride DARC layer over the first oxide hard mask layer, forming a photoresist layer over the DARC layer, patterning the photoresist layer to form a photoresist pattern, and transferring the photoresist pattern to the device layer using the DARC layer, the first oxide hard mask layer and the organic hard mask layer.

DETAILED DESCRIPTION OF THE EMBODIMENTS

In the prior art configuration, the thick DARC layer 106 serving as a hard mask in etching steps is used together with the organic BARC layer 109 to provide satisfactory anti-reflection properties required for photolithography. However, the addition of a BARC layer generally requires thicker resists, and ultimately leads to increased aspect ratio of lithographic features. This is believed to be the main cause of defects including pattern collapse, sloped resist profiles, critical diameter variations, and other abnormalities.

One embodiment of this invention provides a method of making a device in which an oxide hard mask layer is used below a thin DARC layer. This allows the BARC layer to be omitted. The method comprises forming a device layer, forming an organic hard mask layer over the device layer, forming a first oxide hard mask layer over the organic hard mask layer, forming DARC layer, such as a silicon oxynitride DARC layer or any other suitable DARC material layer, having a thickness of less than 60 nm over the first oxide hard mask layer, forming a photoresist layer over the DARC layer to form a photoresist pattern, and transferring the photoresist pattern to the device layer using the DARC layer, the first oxide hard mask layer and the organic hard mask layer. Preferably, the DARC layer comprises silicon oxynitride and the organic hard mask layer comprises amorphous carbon. However, other materials may also be used, such as a nitrogen free DARC. In some embodiments, the device layer can be electrically conductive, insulating, semiconductor, or a multi-layer thereof. The desired pattern of device layer can have a rail, pillar, contact hole or any other shape. Preferably, but not necessarily, the step of transferring the photoresist pattern to the device layer using the DARC layer, the first oxide hard mask layer and the organic hard mask layer occurs in a single pass using different etch chemistry for etching different layers. For example, the DARC layer, the first oxide hard mask layer and the organic hard mask layer can be etched sequentially without breaking vacuum. The etching may be conducted in a single pass through multiple chambers of a multi-chamber cluster tool or in the same chamber of an etching apparatus. In one embodiment, the process includes patterning the photoresist layer, patterning the DARC layer and the first oxide hard mask layer using the patterned photoresist layer as a mask, patterning the organic hard mask layer using the patterned DARC and the first oxide hard mask layers as a mask, and patterning the device layer using at least the organic hard mask layer as a mask. The patterned photoresist layer is consumed during the organic hard mask etch and the DARC and oxide hard mask layers are consumed during the device layer etch. Different etching gases may be used for etching different layers. Other etching methods may also be used.

In one embodiment, the device layer comprises a conductive material, such as a metal or metal alloy, which is patterned into rail shaped electrodes. Alternatively, the device layer may comprise an insulating layer which is patterned into a desired shape or where openings or vias (such as contact holes) are etched in the insulating layer. In general, any suitable shapes or features may be formed, such as nonvolatile or volatile memory cells, capacitors features, gate electrodes, conducting contacts, conducting lines (such as word lines or bit lines), or isolation features. In another embodiment, the device layer comprises at least one semiconductor layer, the step of patterning the device layer forms an array of semiconductor pillars, and each pillar in the array of pillars comprises a diode. The diode may be a steering element of a memory cell which also includes a storage element. In some embodiments, the storage element comprises a resistivity switching element. The resistivity switching element can be a metal oxide, silicon oxide or silicon nitride antifuse dielectric layer or another switching element, and the diode and the metal oxide antifuse dielectric layer can be arranged in series. The memory cell can be further located in a monolithic three dimensional array of memory cells. The memory cell can be a read/write memory cell or a rewritable memory cell. The memory cell type can be selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory. U.S. application Ser. Nos. 11/864,532 and 11/819,595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

Figure 2:
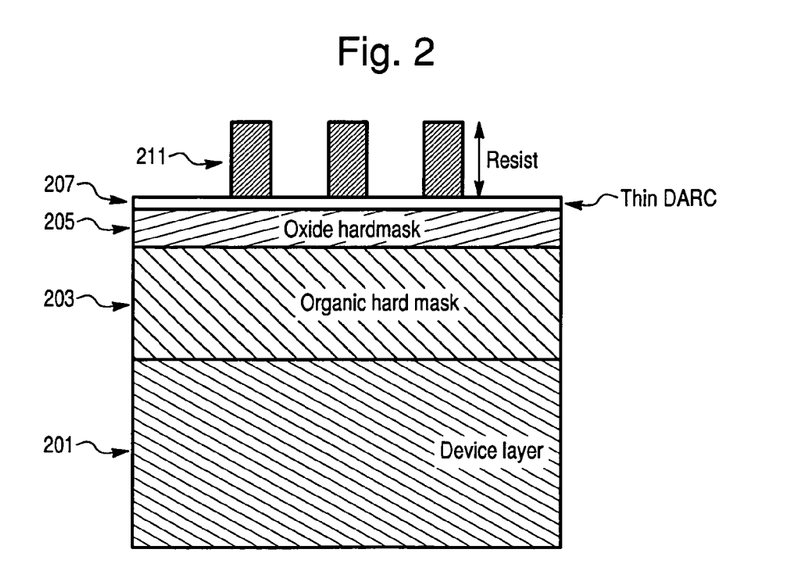
FIG. 2 is a side cross-sectional view illustrating a hard mask configuration of a first embodiment of the invention.
Figure 3:
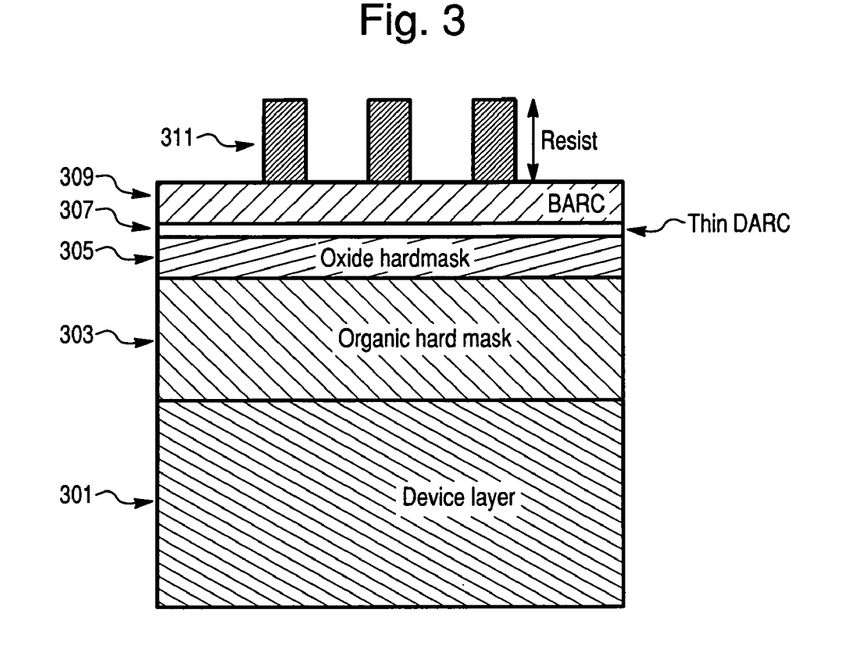
FIG. 3 is a side cross-sectional view illustrating a hard mask configuration of a second embodiment of the invention.

A stack of the first embodiment is shown in FIG. 2. The stack includes an oxide hard mask 205 and a thin DARC layer 207 to replace layers 106 and 109 in prior art stack of FIG. 1. The BARC layer is omitted. Optionally, in a second embodiment, an additional BARC layer 309 can be added on top of the thin DARC layer 307 and the oxide hard mask 305, as shown in FIG. 3. The thin DARC layer (207 or 307) comprises silicon oxynitride and has a thickness less than 60 nm, preferably ranging from 25 nm to 50 nm, such as from 20 nm to 45 nm, for example from 25 nm to 40 nm or from 30 nm to 35 nm. The DARC layer may be less than 25 nm thick. The oxide hard mask layer (205, 305) may comprise silicon oxide. The thickness of the oxide hard mask layer (205, 305) can vary and generally be determined by the requirements of etching steps in a particular process. In one embodiment, the organic hard mask layer (203, 303) comprises amorphous carbon, such as an APF film. The device layer (201, 301) is described above.

Figure 4:
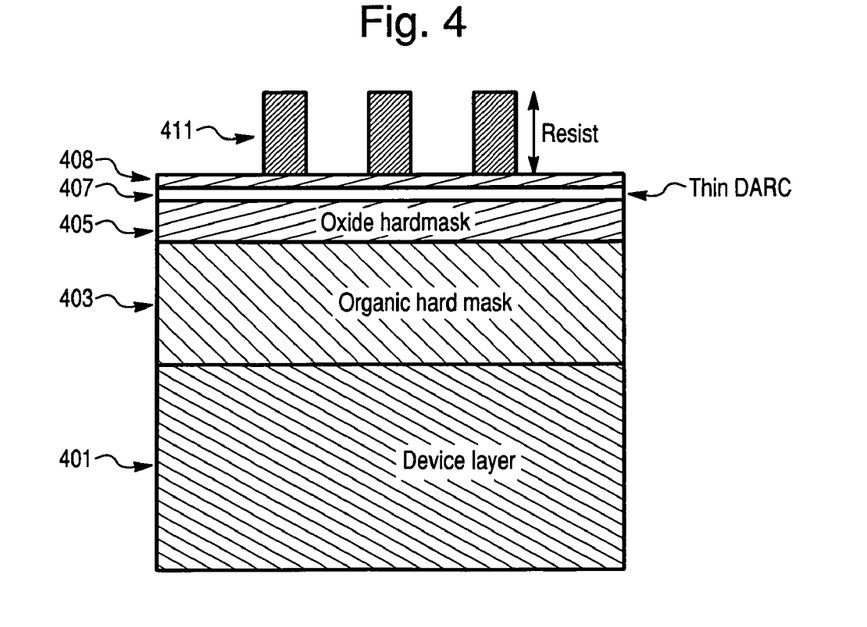
FIG. 4 is a side cross-sectional view illustrating a hard mask configuration of a third embodiment of the invention.
Figure 5:
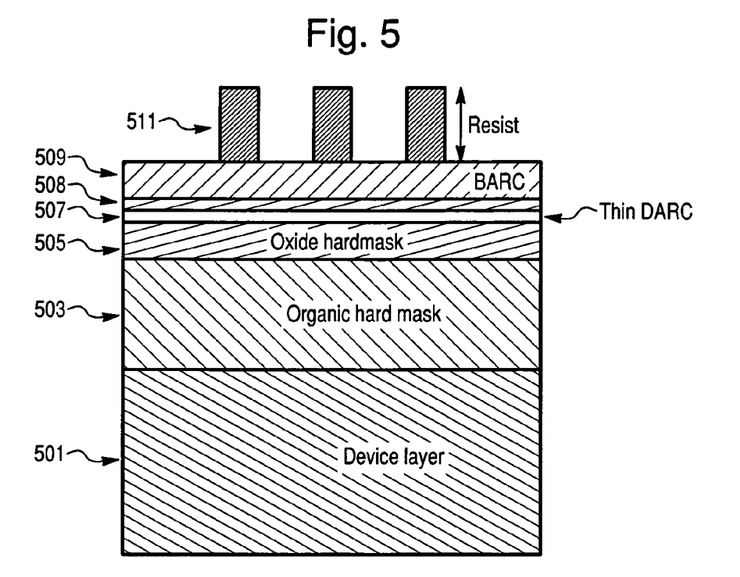
FIG. 5 is a side cross-sectional view illustrating a hard mask configuration of a fourth embodiment of the invention.

In a third embodiment, shown in FIG. 4, a second thin oxide layer 408 can be added on top of the stack, allowing the resist (411) to be stripped and reworked without compromising the integrity of DARC layer (407) and the first oxide hard mask (405) below. Optionally, a BARC layer 509 can also be added on top of the second thin oxide layer (508), as shown in FIG. 5. The first oxide hard mask layer (405, 505) and the second oxide layer (408, 508) may comprise silicon oxide layers. The second oxide layer (408, 508) has a thickness of about 3 nm to about 10 nm. The thickness of the first oxide hard mask layer (405, 505) can vary and generally be determined by the requirements of etching steps in a particular process.

In another embodiment, a DARC layer having an optimized refractive index (n, k) is used to further reduce the reflection. In the prior art stack shown in FIG. 1, the real part n of refractive index of DARC layer is 1.82, and the imaginary part k of same layer is 0.175. However, when a 60 nm thickness of the prior art DARC layer (106) is used, the resulting reflectivity is about 0.014 for rail-shape module (i.e., when an electrode is patterned), or 0.011 for pillar-shape module (i.e., when a pillar diode is patterned), respectively. The reflectivity can be significantly reduced by using DARC layers with optimized n and k values. The detailed results of simulations are demonstrated in FIGS. 6 and 7, as will be described below.

More specifically, in one embodiment, the DARC layer (207, 307, 407, 507) has a refractive index with a real part (n) of less than 2.0 and an imaginary part (k) of less than 0.45, preferably with a real part (n) of less than 1.85 and an imaginary part (k) of less than 0.5, preferably with a real part (n) ranging from 1.5 to 2 and an imaginary part (k) ranging from 0.05 to 0.35. In another embodiment, the DARC layer (207, 307, 407, 507) has a refractive index with the imaginary part (k) of less than 0.3, and preferably with the imaginary part (k) ranging from 0.05 to 0.2. The patterned device layer can have a rail shape or a pillar shape, or a mixture thereof. The optimum refractive index of DARC layer in a particular case can be affected by the numerical aperture of the scanner, the type and size of the patterns and the mask, etc.

Figure 6A:
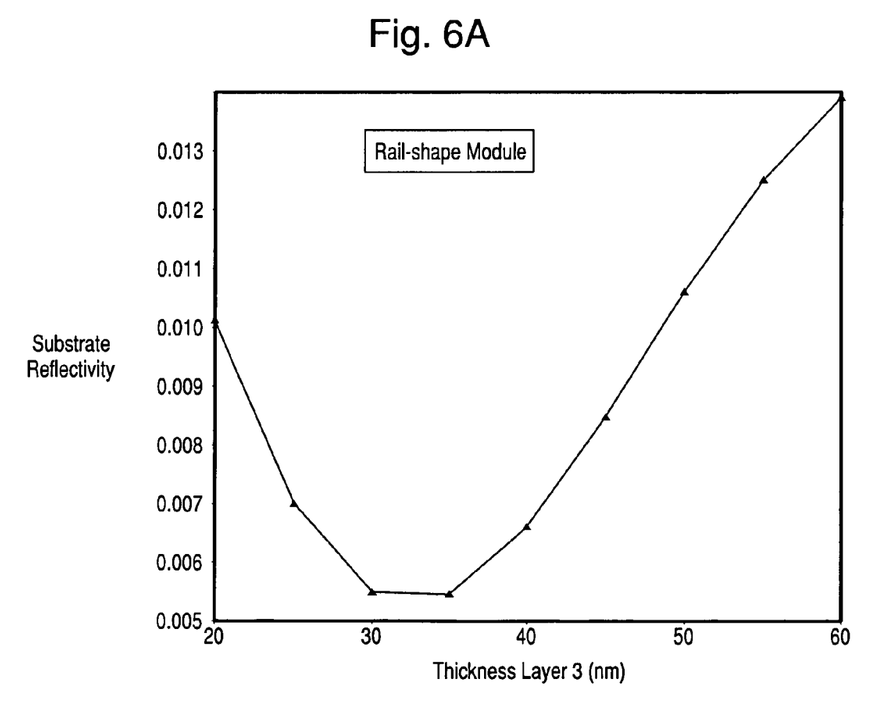
FIGS. 6A and 6B are simulation results showing substrate reflectivity as a function of DARC layer thickness. A rail-shape module is used for simulations in FIG. 6A, and a pillar-shape module is used for simulations in FIG. 6B.
Figure 6B:
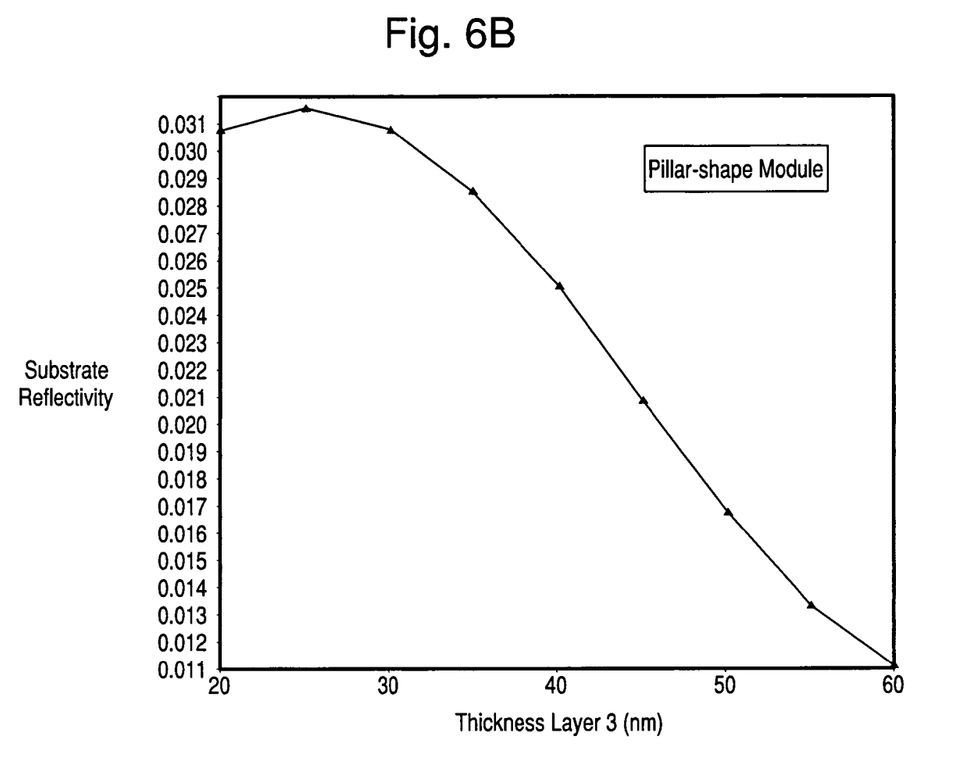

FIGS. 6A and 6B are simulations demonstrating the dependence of reflectivity on the DARC layer thickness while refractive index (n, k) of the DARC is held constant at 1.82, 0.175, respectively. FIG. 6A refers to the rail shape module, and FIG. 6B refers to the pillar shape module.

As shown in FIG. 6A, when a rail-shape module is used, simulations show that a minimum reflectivity, as small as around 0.0055, can be achieved by using a thin DARC layer. Such small reflectivity provided by a thin DARC layer can be sufficient for enhanced photo resist performance in immersion lithography. However, the thin DARC layer may lose the desired etch resistance when used as a hard mask. In embodiments of this invention, an underlying oxide hard mask is combined with the thin DARC layer in order to achieve desired etch resistance in the pattern transfer process. In contrast, when a pillar module is used, the minimum reflectivity is obtained when a thicker DARC layer (60 nm or above) is used, as shown in FIG. 6B. However, the minimum reflectivity is still as high as 0.011 which is higher than desired for enhanced photo resist performance.

Figure 7A:
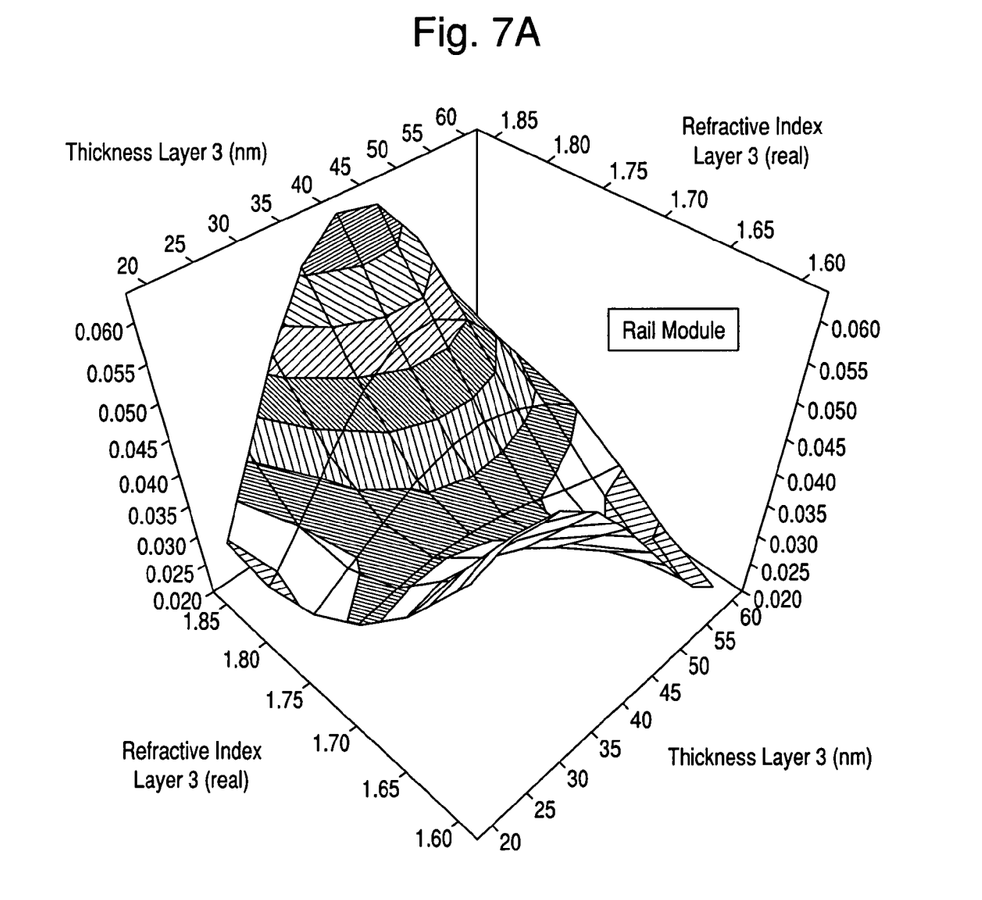
FIGS. 7A and 7B are simulation results showing substrate reflectivity as a function of thickness, real refractive index (n), and imaginary refractive index (k) of the DARC layer. A rail-shape module is used for simulations in FIG. 7A, and a pillar-shape module is used for simulations in FIG. 7B.
Figure 7B:
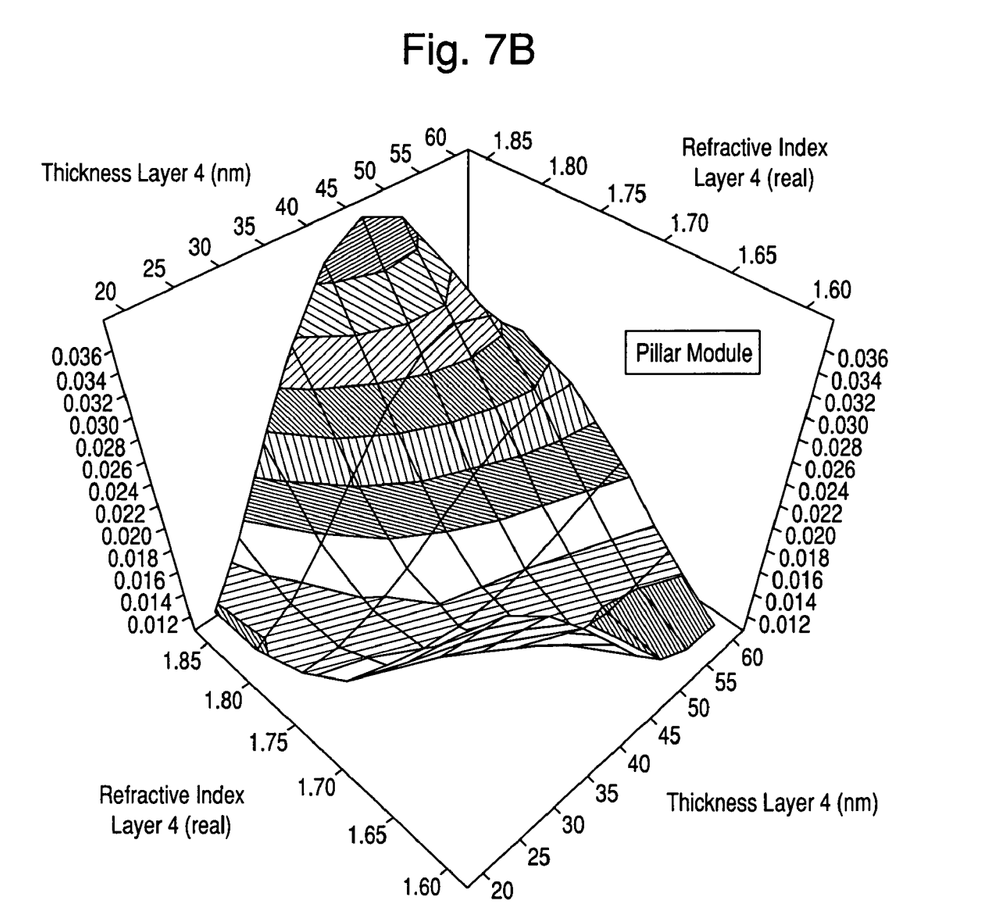

Further simulations shown in FIGS. 7A and 7B demonstrate that in addition to tuning thickness, the reflectivity can be significantly improved by tuning the refractive index of a DARC layer. In regard to the rail-shape module, a minimum reflectivity of 0.0016 can be achieved by using a refractive index of n, k of around (1.6, 0.02) even for a relative thick DARC layer having a thickness of around 60 nm, as shown in FIG. 7A. In regard to the pillar-shape module, a minimum reflectivity of 0.0024 can be achieved by similar DARC thickness and refractive index values of n, k of (1.6, 0.012). A desired refractive index and thickness can be tuned according to a particular process and/or system. For example, in order to achieve low reflectivity for enhanced photoresist performance, different resists may require a DARC having different thickness and reflective index.

DARC materials and oxides can be deposited in same chamber, minimizing turnaround time of processing. They can be prepared by conventional chemical vapor deposition, or via spin-on methods (such as spin-on-glass materials).

Furthermore, since the DARC layer and oxide hard mask are both dielectrics, no major undertaking is needed for etch development. The same etch recipe can be used for DARC (207, 307, 407, 507) and oxide hard mask (205, 305, 405, 505, and optionally for oxide layer (408, 508). Any suitable etching gas or liquid can be used, especially those generally used to etch oxide, nitride, and oxynitride layers, such as $CF_4$/$CHF_3$ based chemistries. All types of etchers can be used. In some embodiments, $CF_4$/HBr chemistry or a mixture of $Cl_2$/$BCl_3$ based reactants in poly or metal etchers can also be used. Moreover, gas additives such as $O_2$, $N_2$, He, and Ar can be introduced into the chamber to control critical dimension bias and improve etch uniformity. The chemistry of choice for this step is typically not very selective between DARC and oxide, especially when a thin layer of sacrificial oxide (408, 508) is deposited on top of the DARC, reducing possibility of resist poisoning.

The first oxide hard mask (205, 305, 405, 505), the optional the second oxide mask (408, 508), and DARC layer (207, 307, 407, 507) work in concert to serve as a mask in step of patterning organic hard mask (203, 303, 403, 503), allowing a thick organic hard mask (203, 303, 403, 503) to be patterned in order to further serve as a mask for patterning the device layer (201, 301, 401, 501). The thickness of oxide hard mask can be tuned to fulfill the requirement on mask for patterning organic hard mask (203, 303, 403, 503) with a particular thickness, so that the thickness of DARC layer (207, 307, 407, 507) can be tuned independently to achieve a surface reflectivity providing optimum resist imaging.

One or more photosensitive layers (211, 311, 411, 511) can be formed and patterned over the stack described above. For example, photosensitive layers used in 45 nm type lithography may be used, for example, 193 nm radiation sensitive photoresist. Other photosensitive layer or layers may also be used. Immersion lithography (i.e., a lithography which utilizes a liquid at the interface) may be used to expose the photoresist. A topcoat may be used on top of the photoresist to prevent diffusion of chemical by-products into water and lens during exposure. Alternatively, a top-coat free photoresist may be used. Other lithography methods, including but not limited to regular UV or X-ray methods, may also be used.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a device, comprising:
   forming a device layer;
   forming an organic hard mask layer over the device layer;
   forming a first oxide hard mask layer over the organic hard mask layer;
   forming a DARC layer having a thickness of less than 60 nm over the first oxide hard mask layer;
   forming a second oxide layer over the DARC layer;
   forming a BARC layer over the second oxide layer;
   forming a photoresist layer over the BARC layer;
   patterning the photoresist layer to form a photoresist pattern; and
   transferring the photoresist pattern to the device layer using the BARC layer, the second oxide layer, the DARC layer, the first oxide hard mask layer and the organic hard mask layer.

2. The method of claim 1, wherein the DARC layer comprises a silicon oxynitride layer.

3. The method of claim 2, wherein the step of transferring the photoresist pattern to the device layer comprises:
   patterning the DARC layer and the first oxide hard mask layer using the patterned photoresist layer as a mask;
   patterning the organic hard mask layer using the patterned DARC and the first oxide hard mask layers as a mask; and
   patterning the device layer using at least the organic hard mask layer as a mask.

4. The method of claim 3, wherein the step of transferring the photoresist pattern to the device layer occurs in a single pass.

5. A method of claim 3, wherein the organic hard mask layer comprises amorphous carbon and the step of patterning the device layer forms conductive rails.

6. A method of claim 1, wherein the first oxide hard mask layer and the second oxide layer comprise silicon oxide layers and the second oxide layer has a thickness of about 3 nm to about 10 nm.

7. A method of claim 1, wherein the DARC layer has a thickness ranging from 20 nm to 45 nm.

8. A method of claim 1, wherein the DARC layer has a thickness ranging from 25 nm to 40 nm.

9. A method of claim 1, wherein the DARC layer has a refractive index with a real part (n) ranging from 1.5 to 2 and an imaginary part (k) ranging from 0.05 to 0.35.

10. A method of making a device, comprising:
    forming a device layer;
    forming an organic hard mask layer over the device layer;
    forming a first oxide hard mask layer over the organic hard mask layer;
    forming a DARC layer over the first oxide hard mask layer;
    forming a second oxide layer over the DARC layer;
    forming a BARC layer over the second oxide layer;
    forming a photoresist layer over the DARC layer;
    patterning the photoresist layer to form a photoresist pattern; and
    transferring the photoresist pattern to the device layer using the BARC layer, the second oxide layer, the DARC layer, the first oxide hard mask layer and the organic hard mask layer.

11. A method of claim 10, wherein the first oxide hard mask layer and the second oxide layer comprise silicon oxide layers and the second oxide layer has a thickness of about 3 nm to about 10 nm.

12. A method of claim 10, wherein the DARC layer has a refractive index with a real part (n) of less than 2.0 and an imaginary part (k) of less than 0.45.

13. A method of claim 10, wherein the step of patterning the photoresist layer is performed by immersion photolithography.

14. The method of claim 10, wherein the DARC layer comprises a silicon oxynitride layer.

15. The method of claim 14, wherein the step of transferring the photoresist pattern to the device layer comprises patterning the DARC layer and the first oxide hard mask layer using the patterned photoresist layer as a mask;
    patterning the organic hard mask layer using the patterned DARC and the first oxide hard mask layers as a mask; and
    patterning the device layer using at least the organic hard mask layer as a mask.

16. The method of claim 15, wherein the step of transferring the photoresist pattern to the device layer occurs in a single pass.

17. A method of claim 15, wherein:
    the device layer comprises at lease one semiconductor layer;
    the step of patterning the device layer forms an array of semiconductor pillars; and
    the DARC layer has a refractive index with the real part (n) of less than 1.85 and the imaginary part (k) of less than 0.5.

18. A method of claim 17, wherein the DARC layer has a refractive index with the imaginary part (k) of less than 0.3.

19. A method of claim 18, wherein the DARC layer has a refractive index with the imaginary part (k) ranging from 0.05 to 0.2.

20. A method of claim 17, wherein each pillar in the array of pillars comprises a diode.

21. A method of claim 20, wherein the diode is a steering element of a memory cell and wherein the memory cell further comprises a storage element.

22. A method of claim 21, wherein:
    the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory;

the storage element comprises a resistivity switching element;

the memory cell is a read/write memory cell or a rewritable memory cell; and the memory cell is located in a monolithic three dimensional array of memory cells.

23. A method of claim 10, wherein the step of transferring the photoresist pattern to the device layer comprises forming at least one of pillar, rail, or via in the device layer.

24. A method of claim 10, wherein the step of transferring the photoresist pattern to the device layer comprises forming at least one of a memory cell, a capacitor, a gate electrode, a conducting contact, a conducting line, or an isolation feature in the device layer.

25. The method of claim 10, wherein the photoreisist pattern is a rail and wherein the method further comprises selecting a thickness and a refractive index value of the DARC layer to maintain a reflectivity of about 0.0016.

26. The method of claim 25, wherein the refractive index value has a real part (n) of about 1.6 and the imaginary part (k) of about 0.02 and wherein the thickness is about 60 nm.

27. The method of claim 10, wherein the photoresist pattern is a pillar and wherein the method further comprises selecting a thickness and a refractive index value of the DARC layer to maintain a reflectivity of about 0.0024.

28. The method of claim 27, wherein the refractive index value has a real part (n) of about 1.6 and the imaginary part (k) of about 0.012 and wherein the thickness is about 60 nm.

29. A method of making a device, comprising:
forming a device layer;
forming an organic hard mask layer over the device layer;
forming a first silicon oxide hard mask layer over the organic hard mask layer;
forming a DARC layer over the first oxide hard mask layer;
forming a photoresist layer over the DARC layer;
patterning the photoresist layer to form a photoresist pattern; and
transferring the photoresist pattern to the device layer using the DARC layer, the first oxide hard mask layer and the organic hard mask layer.

30. The method of claim 29, further comprising:
forming a BARC layer between the DARC layer and the photoresist layer; and
forming second oxide layer between the DARC layer and the BARC layer;
wherein:
the step of transferring the photoresist pattern to the device layer comprises using the BARC layer, the second oxide layer, the DARC layer, the first oxide hard mask layer and the organic hard mask layer; and
the first silicon oxide hard mask layer consists essentially of silicon oxide.

* * * * *